United States Patent
Tanaka et al.

(10) Patent No.: US 10,388,877 B2
(45) Date of Patent: Aug. 20, 2019

(54) FLEXIBLE DISPLAY DEVICE AND PRODUCING METHOD OF THE SAME

(71) Applicant: Japan Display Inc., Tokyo (JP)

(72) Inventors: Masaki Tanaka, Tokyo (JP); Hajime Akimoto, Tokyo (JP)

(73) Assignee: Japan Display Inc., Tokyo (JP)

( * ) Notice: Subject to any disclaimer, the term of this patent is extended or adjusted under 35 U.S.C. 154(b) by 247 days.

(21) Appl. No.: 15/406,262

(22) Filed: Jan. 13, 2017

(65) Prior Publication Data
US 2017/0213964 A1 Jul. 27, 2017

(30) Foreign Application Priority Data
Jan. 26, 2016 (JP) .................................. 2016-012088

(51) Int. Cl.
| | | |
|---|---|---|
| H01L 51/54 | (2006.01) |
| H01L 51/00 | (2006.01) |
| C08F 220/70 | (2006.01) |
| H01L 27/32 | (2006.01) |
| H01L 51/50 | (2006.01) |
| H01L 51/52 | (2006.01) |
| H01L 51/56 | (2006.01) |

(52) U.S. Cl.
CPC .......... H01L 51/004 (2013.01); C08F 220/70 (2013.01); *H01L 27/3244* (2013.01); *H01L 51/0097* (2013.01); *H01L 51/5012* (2013.01); *H01L 51/5056* (2013.01); *H01L 51/5072* (2013.01); *H01L 51/5206* (2013.01); *H01L 51/5221* (2013.01); *H01L 51/56* (2013.01); *H01L 2251/5338* (2013.01)

(58) Field of Classification Search
CPC .. C08F 220/70; H01L 51/004; H01L 51/0097; H01L 51/0032; H01L 51/005; H01L 51/50; H01L 51/5072; H01L 51/56; H01L 51/5221; H01L 51/5206; H01L 2251/5338; H01L 27/3244

USPC ....... 428/690, 691, 917, 411.4, 336; 427/58, 427/66; 313/500–512; 257/40, 88–104, 257/E51.001–E51.052; 252/301.16–301.16
See application file for complete search history.

(56) References Cited

FOREIGN PATENT DOCUMENTS

JP 2011-228361 A 11/2011

OTHER PUBLICATIONS

Takahiro Kakuta et al., Preorganized Hydrogel: Self-Healing Properties of Supramolecular Hydrogels Formed by Polymerization of Host-Guest-Monomers that Contain Cyclodextrins and Hydrophobic Guest Groups. Advanced Materials. Feb. 19, 2013, 25, 2849-2853, Wiley-VCH, Germany.

Hiroyasu Yamaguchi et al., Self-Assembly of Gels through Molecular Recognition of Cyclodextrins: Shape Selectivity for Linear and Cyclic Guest Molecules. Macromolecules. Mar. 25, 2011, 44, 2395-2399, American Chemical Society, Washington D.C.

*Primary Examiner* — Andrew K Bohaty
(74) *Attorney, Agent, or Firm* — Michael Best & Friedrich LLP

(57) ABSTRACT

A flexible display device includes a hole transport layer, a light emitting layer, an electron transport layer arranged between a first electrode layer and a second electrode layer. The hole transport layer and the electron transport layer each contain a polyacrylamide comprising a guest part and/or a host part which interacts with the guest part. The host part may be selected from the group consisting of an α-cyclodextrinyl group, a β-cyclodextrinyl group, and a γ-cyclodextrinyl group, and the guest part may be selected from the group consisting of an n-butyl (ester) group, an n-hexyl (ester) group, an n-dodecyl (ester) group, an n-dodecyl (amide) group, an adamantyl group, a cyclohexyl (ester) group, and a cyclododecyl (amide) group, which can interact with the selected host part.

16 Claims, 7 Drawing Sheets

Chemical formula (1)

Chemical formula (2)

Chemical formula (3)

Chemical formula (4)

000# FLEXIBLE DISPLAY DEVICE AND PRODUCING METHOD OF THE SAME

CROSS REFERENCE TO RELATED APPLICATIONS

This application is based upon and claims the benefit of priority from the prior Japanese Patent Application No. 2016-012088, filed on Jan. 26, 2016, the entire contents of which are incorporated herein by reference.

FIELD

The present invention relates to a flexible display device and a producing method of the same and, more particularly, to a flexible display device with improved adhesion between organic thin films and a producing method of the same.

BACKGROUND

An organic electroluminescence element (to be also referred to as an "organic EL element" hereinafter) has a structure in which a pair of electrodes sandwich a thin film containing an organic electroluminescence material (to be also referred to as an "organic EL material" hereinafter). An organic EL element can control luminescence intensity by a voltage to be applied or the amount of current flowing in the element. A display device has been developed, which has a display screen formed by forming pixels using this property.

A display device using organic EL elements can display an image by individually controlling the luminescence of each pixel. This eliminates the need for the backlight required in transmissive liquid crystal display devices and hence can implement thinner display devices. In addition, since a circuit using organic EL elements and thin film transistors which drive them can be formed on an organic resin film, a flexible display device whose substrate itself has flexibility is being developed.

The flexibility of an organic EL element is a highly advantageous point as compared with other types of display devices such as liquid crystal display devices and PDP display devices. However, basically, the organic EL element has a structure simply formed by stacking organic thin films using a method like vapor deposition, which cannot ensure adhesion, and hence the adhesion strength between the thin films is weak. This may result in film peeling. For example, Japanese Patent Laid-Open No. 2011-228361 discloses organic semiconductor materials having excellent adhesion to metal thin films.

SUMMARY

According an embodiment of the present invention, there is provided a flexible display device comprising a hole transport layer, a light emitting layer, an electron transport layer arranged between a first electrode layer and a second electrode layer, wherein the hole transport layer and the electron transport layer each contain a polyacrylamide comprising a guest part and/or a host part, which can interact with the guest part.

According to an embodiment of the present invention, there is provided a producing method of flexible display device comprising forming a hole transport layer on a first electrode layer, forming a light emitting layer on the hole transport layer, forming an electron transport layer on the light emitting layer, and forming a second electrode layer on the electron transport layer, wherein the hole transport layer and the electron transport layer each are formed by using a material containing a polyacrylamide comprising a guest part and/or a host part, which can interact with the guest part.

DESCRIPTION OF EMBODIMENTS

Figure 1A:
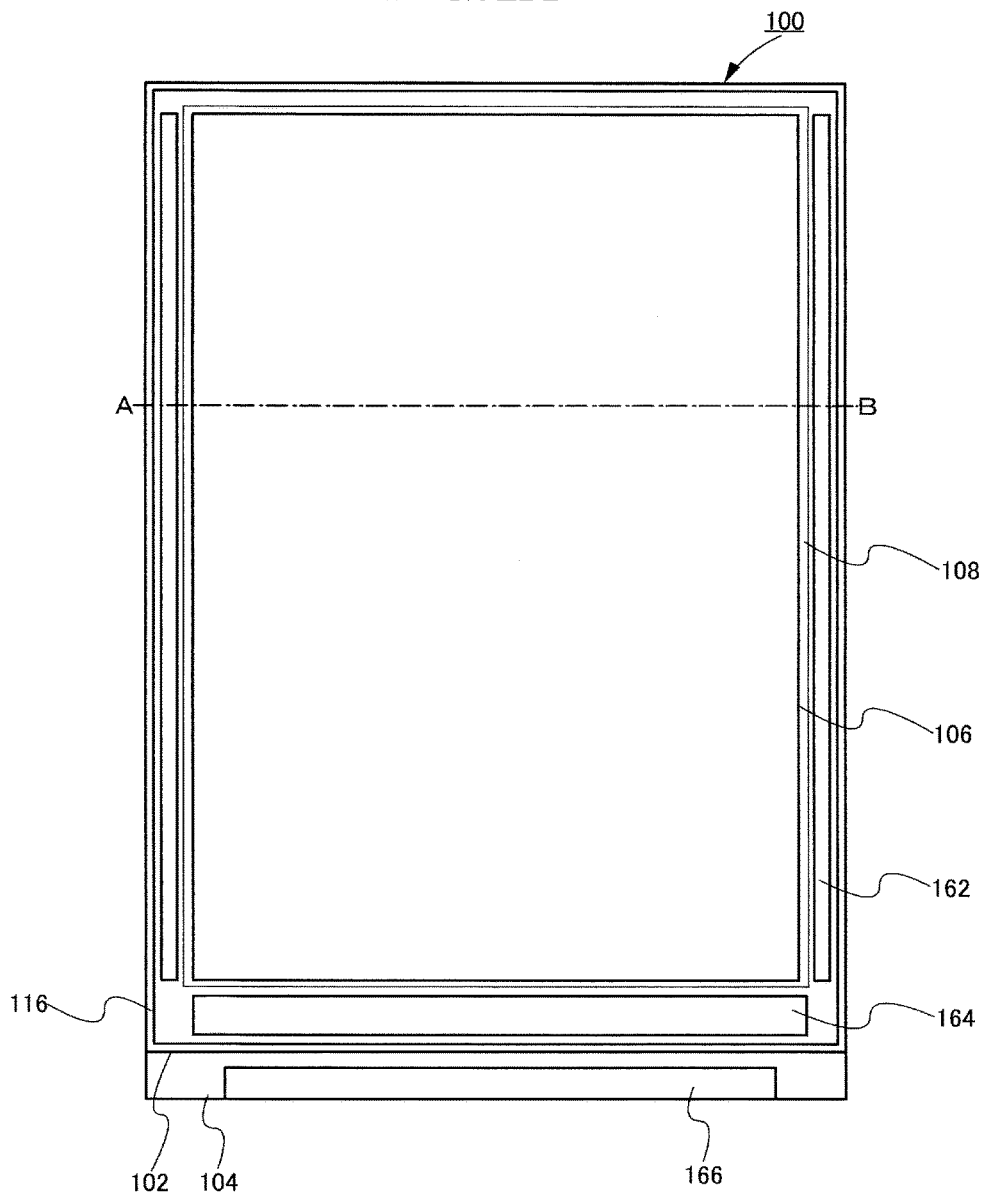
FIGS. 1A and 1B are, respectively, a plan view and a sectional view of a flexible display device according to an embodiment of the present invention.

Embodiments of the present invention will be described below with reference to the accompanying drawings and the like. Note, however, that the present invention can be carried out in many different modes and should not be interpreted by only the written contents of embodiments exemplified below. In addition, for the sake of clearer explanation, the drawings sometimes show each portion more schematically than in actual modes in terms of width, thickness, shape, and the like. However, each drawing shows merely an example and should not limit the interpretation of the present invention. Furthermore, in this specification and the drawings, the same reference numerals denote the same elements as those described with reference to preceding drawings, and a detailed description will be appropriately omitted.

In this specification, a case in which a given member or region is located "on (or under)" another member or region includes not only a case in which a given member or region is located immediately above (or immediately below) another member or region but also a case in which a given member or region is located above (or below) another member of region, unless otherwise specified. That is, this case also includes a case in which another constituent element is located above (or below) another member or region so as to be included between a given member or region and another member or region.

To improve the adhesion strength between organic thin films, it is conceivable to use a method of making the molecular structure of an organic material contain a functional group which interacts with a material for an adjacent thin film. However, a change in molecular structure greatly influences the properties of the organic semiconductor material, and hence this limits the degree of freedom in material selection. The present invention provides a producing method of a flexible display device with improved adhesion between organic thin films.

First Embodiment

Figure 1B:
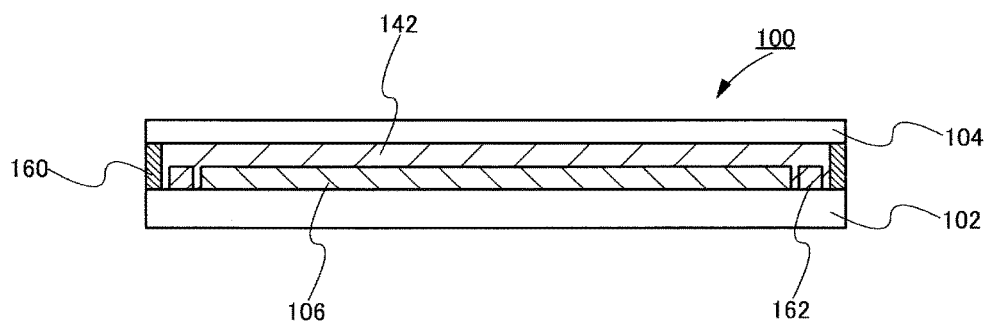

<Arrangement of Flexible Display Device>
FIGS. 1A and 1B show the arrangement of a flexible display device according to an embodiment of the present invention. FIG. 1A is a plan view showing a flexible display device 100. FIG. 1B shows a sectional structure corresponding to the A-B line in FIG. 1A.

The flexible display device 100 includes a pixel unit 106 having a two-dimensional array of a plurality of pixels. The pixel unit 106 is provided on a first substrate 102. The first substrate 102 is provided with a scanning line driving circuit 162, a video signal line driving circuit 164, an input terminal unit 166, and the like. A second substrate 104 is provided to face the first substrate 102 and seal the pixel unit 106.

The second substrate 104 is fixed to the first substrate 102 with a sealing material 160. The second substrate 104 and the first substrate 102 are fixed to each other with a gap of several μm to several ten μm between them. This gap portion is provided with a filler 142. As the filler 142, a resin material is suitably used. The pixel unit 106 is sandwiched between the second substrate 104 and the first substrate 102, and the filler 142 is enclosed between the substrates. This technique is also called solid sealing.

Each pixel in the pixel unit 106 is provided with a luminescence element. As a luminescence element, for example, an organic EL element using an organic EL material for a light emitting layer is used. A pixel circuit individually controls the luminescence of each pixel in the pixel unit 106. The scanning line driving circuit 162 and the video signal line driving circuit 164 supply signals for controlling the luminescence of each pixel.

The flexible display device 100 shown in FIGS. 1A and 1B has a top emission type arrangement designed to make luminescence from the pixel unit 106 exit to the second substrate 104.

Note that in a top emission type device, since the second substrate 104 needs to have translucency, a glass or resin material is used for the substrate. It is preferable to use, as a resin material with excellent translucency, for example, a material containing a resin material selected from polybenzoxazole, a polyamide having an alicyclic structure, a polyimide having an alicyclic structure, polyamide, and poly(p-xylene). The second substrate 104 may contain one of these resin materials or a combination of a plurality of types of these resin materials. For example, the second substrate 104 using a polyimide resin can be formed by coating a support substrate 152 with a solution containing a polyamic acid (including a partly imidized polyamic acid) as a precursor of polyimide or a fusible polyimide and calcining the resultant structure.

Figure 2:
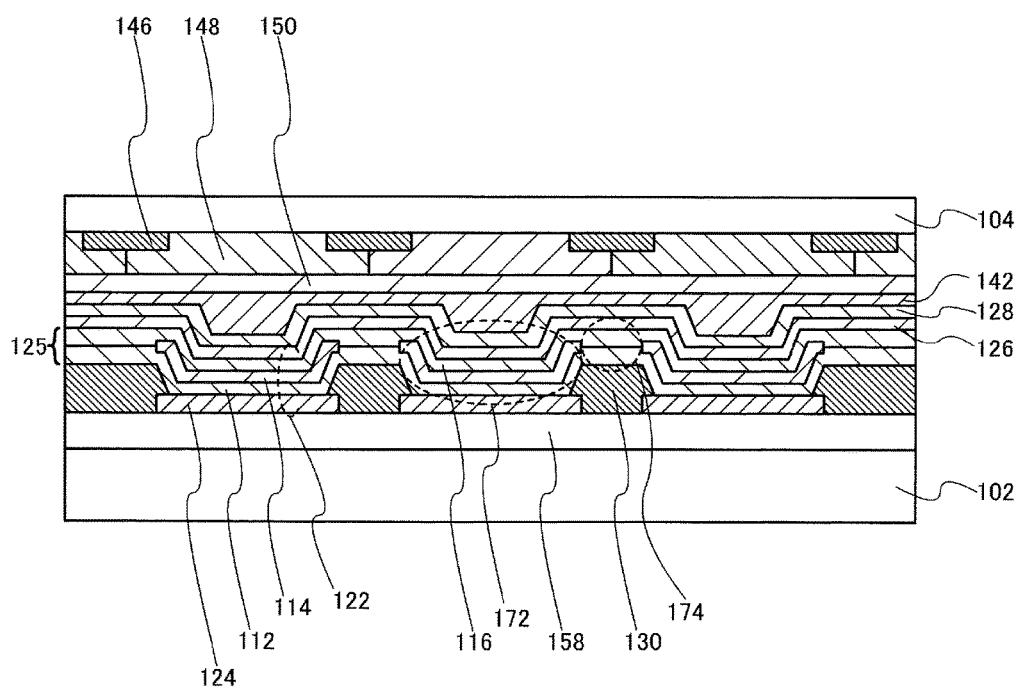
FIG. 2 is a sectional view showing the arrangement of an organic EL element 122 in a pixel unit 106 according to an embodiment of the present invention.
Figure 3:
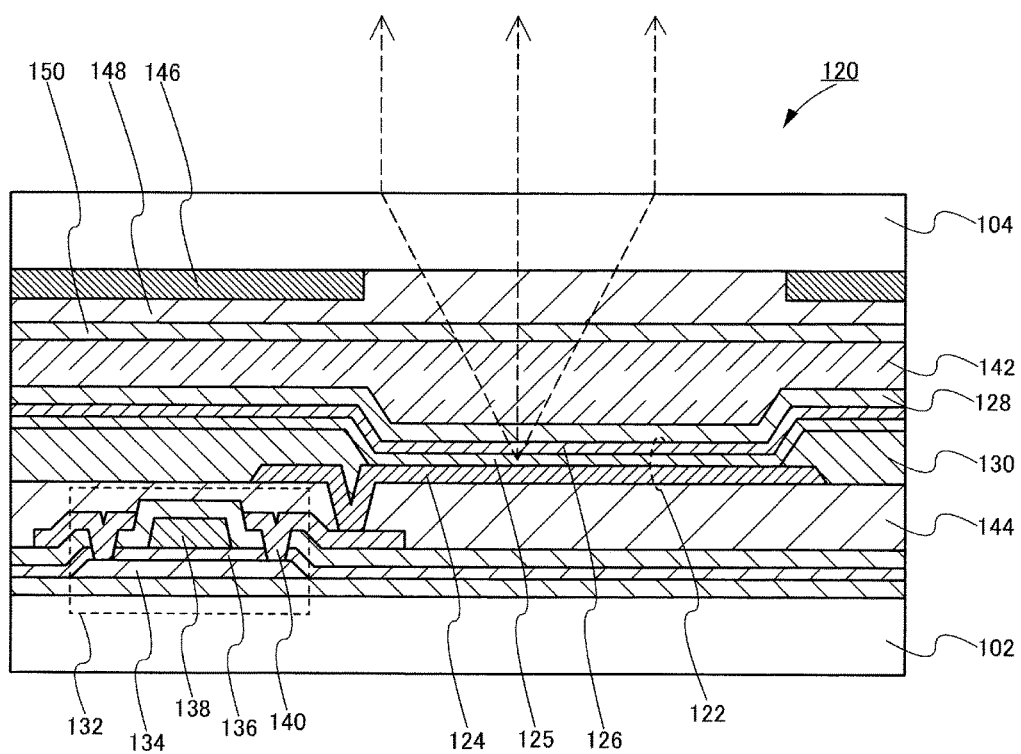
FIG. 3 is a sectional view showing the arrangement of a pixel 120 in a pixel unit 106 according to an embodiment of the present invention.

The arrangement of the pixel unit 106 will be described with reference to FIGS. 2 and 3. FIG. 2 is a sectional view showing the arrangement of an organic EL element 122 in the pixel unit 106. FIG. 3 is a sectional view showing the arrangement of a pixel 120 in the pixel unit 106. The organic EL element 122 has an arrangement in which an organic EL layer 125 and a common electrode (second electrode layer) 126 are stacked on a pixel electrode (first electrode layer) 124. The organic EL layer 125 can be formed by using a low-molecular or high-molecular organic material. When a low-molecular organic material is used for the organic EL layer 125, the layer is provided with not only a light emitting layer 114 containing an organic luminescence material but also carrier transport layers such as a hole transport layer 112 and an electron transport layer 116 which sandwich the light emitting layer 114. In addition, the organic EL layer 125 may emit red (R) light, green (G) light, and blue (B) light or may produce so-called white luminescence. When the organic EL layer 125 is designed to produce white luminescence, the layer can be made to perform color display by being used in combination with a color filter.

The hole transport layer 112, the light emitting layer 114, and the electron transport layer 116 each contain a polyacrylamide having a guest part and/or a host part which interacts with the guest part. In this embodiment, a host part is selected from an α-cyclodextrinyl group, β-cyclodextrinyl group, and γ-cyclodextrinyl group. In addition, a guest part is selected from an n-butyl (ester) group, n-hexyl (ester) group, n-dodecyl (ester) group, n-dodecyl (amide) group, adamantyl group, cyclohexyl (ester) group, and cyclododecyl (amide) group, which can interact with the selected host part.

Figure 4:
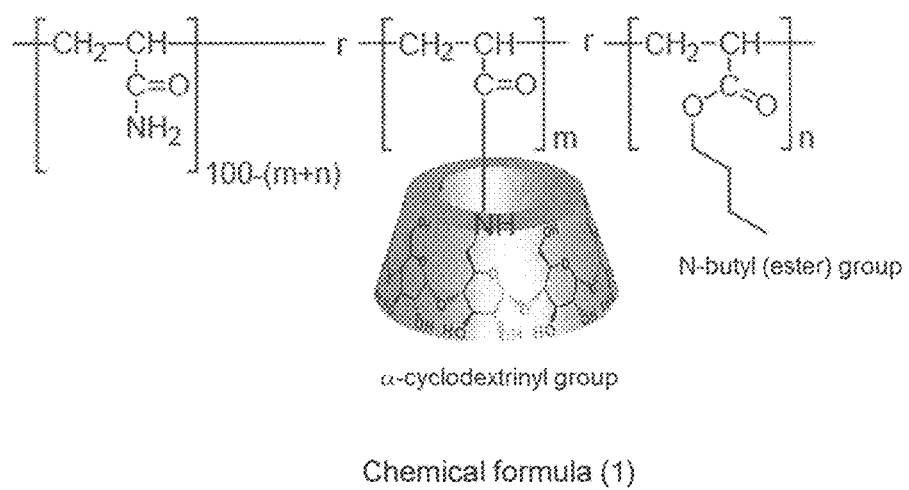
FIG. 4 shows chemical formula (1)

According to an embodiment, a hole transport layer 112, a light emitting layer 114, and an electron transport layer 116 each may contain a polyacrylamide with the host part being an α-cyclodextrinyl group, and the guest part being selected from an n-butyl (ester) group, n-hexyl (ester) group, n-dodecyl (ester) group, and n-dodecyl (amide) group. Such a polyacrylamide is, for example, a compound expressed by chemical formula (1) shown in FIG. 4.

Therefore, a polyacrylamide which can be applied to this embodiment may be a compound obtained by replacing the n-butyl (ester) group in chemical formula (1) with an n-dodecyl (ester) group or n-dodecyl (amide) group.

Figure 5:
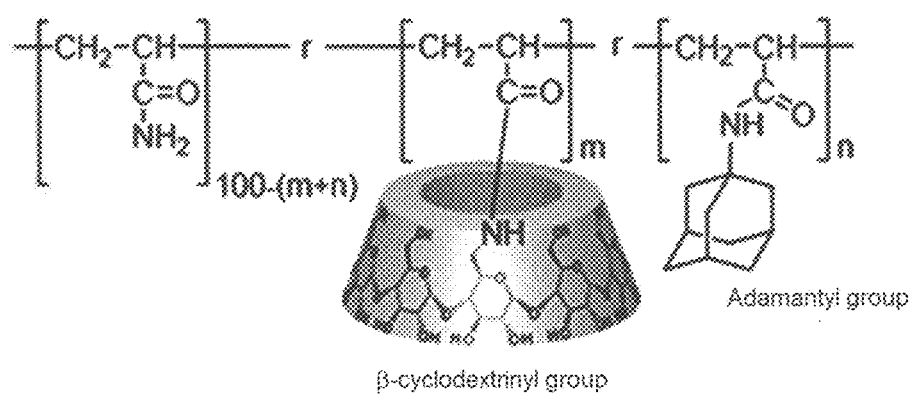
FIG. 5 shows chemical formula (2)

In an embodiment, a hole transport layer 112, a light emitting layer 114, and an electron transport layer 116 each may contain a polyacrylamide with the host part being a β-cyclodextrinyl group, and the guest part being selected from an adamantyl group, cyclohexyl (ester) group, and cyclododecyl (amide) group. Such a polyacrylamide is, for example, a compound expressed by chemical formula (2) shown in FIG. 5.

Therefore, a polyacrylamide which can be applied to this embodiment may be a compound obtained by replacing the adamantyl group in chemical formula (2) with a cyclohexyl (ester) group or cyclododecyl (amide) group.

In an embodiment, a hole transport layer 112, a light emitting layer 114, and an electron transport layer 116 each may contain a polyacrylamide with the host part being an γ-cyclodextrinyl group, and the guest part being a cyclododecyl (amide) group.

Although the above polyacrylamides are disclosed in, for example, Takahiro Kakuta et al., Adv. Mater. 2013, 25, 2849-2853, there is no description about the application of the materials to the hole transport layer 112, the light emitting layer 114, the electron transport layer 116, and the like according to this embodiment. That is, the application of such materials is disclosed for the first time in the present invention.

In an embodiment, a hole transport layer 112, a light emitting layer 114, and an electron transport layer 116 each preferably contain 0.1 wt % or more and 10 wt % or less of the above polyacrylamide. Setting such a concentration range will prevent the polyacrylamide from greatly influencing the electrical and optical properties of the flexible display device.

Letting the hole transport layer 112, the light emitting layer 114, and the electron transport layer 116 each contain a polyacrylamide selected from these materials can provide a flexible display device in which the host parts and the guest parts interact with each other in the interfaces among the hole transport layer 112, the light emitting layer 114, and the electron transport layer 116 to improve the adhesion between the organic thin films.

In addition, the flexible display device according to this embodiment need not apply any modifications or the like to an organic semiconductor material itself which is in charge of charge transport and luminescence. This also produces the effect of broadening the range of choice of semiconductor materials.

In an embodiment, in an organic EL layer 125, a hole injection layer may be arranged between a pixel electrode 124 and a hole transport layer 112, and an electron injection layer may be arranged between a common electrode 126 and an electron transport layer 116. In the organic EL layer 125 having this arrangement, the hole injection layer and the electron injection layer each may contain a polyacrylamide according to this embodiment described above.

Note that this embodiment can use known materials described above as materials for the hole transport layer 112, the light emitting layer 114, the electron transport layer 116, the hole injection layer, and the electron injection layer.

Hole transport materials which can be used for the hole transport layer 112 and the hole injection layer include, for example, benzidine or its derivatives, styrylamine or its derivatives, triphenylmethane or its derivatives, porphyrin or its derivatives, triazole or its derivatives, imidazole or its derivatives, oxadiazole or its derivatives, polyarylalkane or its derivatives, phenylenediamine or its derivatives, arylamine or its derivatives, oxazole or its derivatives, anthracene or its derivatives, fluorenone or its derivatives, hydrazine or its derivatives, stilbene or its derivatives, phthalocyanine or its derivatives, and heterocyclic conjugated monomers, oligomers, and polymers such as polysilane compounds, vinylcarbazole compounds, thiophene compounds, and aniline compounds.

Specific examples of such hole transport materials include α-naphthylphenylediamine (α NPD), porphyrin, metal-tetraphenylporphyrin, metal-naphthalocyanine, 4,4',4"-trimethyltriphenylamine, 4,4',4"-tris(3-methylphenylphenylamino)triphenylamine (m-MTDATA), N,N,N',N'-tetrakis (p-tolyl)p-phenylenediamine, N,N,N',N'-tetraphenyl-4,4'-diaminobiphenyl, N-phenylcarbazole, 4-di-p-tolylaminostilbene, poly(paraphenylenevinylene), poly (thiophenevinylene), and poly(2,2'-thienylpyrrole). However, they are not exhaustive.

Materials which can be used as electron transport materials used for the electron transport layer 116 and the electron injection layer include tris-(8-hydroxyquinoline) aluminum (Alq3), 8-hydroxymethylquinoline aluminum, anthracene, naphthalene, phenanthrene, pyrene, chrysene, perylene, butadiene, coumarin, acridine, stilbene, and their derivatives. However, they are not exhaustive.

The light emitting layer 114 is formed by combining required materials properly selected from the above hole transport materials, electron transport materials, and double charge transport materials, and can contain a red luminescence material, green luminescence material, or blue luminescence material in accordance with the arrangement of pixels.

Red luminescence materials which can be used include, for example, cyclopentadiene derivatives, tetraphenylbutadiene derivatives, triphenylamine derivatives, oxadiazole derivatives, bathophenanthroline derivatives, pyrazoloquinoline derivatives, styrylbenzene derivatives, styrylarylene derivatives, aminostyryl derivatives, silole derivative, thiophene cyclic compounds, pyridine cyclic compounds, perinone derivatives, perylene derivatives, oligothiophene derivatives, coumarin derivatives, rubrene derivatives, quinacridone derivatives, squarylium derivatives, porphyrin derivatives, styryl pigments, tetracene derivatives, pyrazoline derivatives, triflumanilamine derivatives, anthracene derivatives, diphenylanthracene derivatives, pyrene derivatives, carbazole derivatives, oxadiazole dimers, byrazoline dimers, and metal complexes having, as central metals, Al, Zn, Be, Pt, Ir, Tb, Eu, Dy, and the like, and as ligands, oxadiazoles, thiadiazoles, phenylpyridines, phenylbenzoimidazoles, and quinoline structures, such as aluminum quinolinol complexes s, benzoquinolinol beryllium complexes, benzoxazole zinc complexes, benzothiazole zinc complexes, azomethine zinc complexes, porphyrin zinc complexes, europium complexes, iridium complexes, and platinum complexes.

A green luminescence material or materials is or are selected from the above materials and is or are used, as needed.

In addition, a specific example of a blue luminescence material can include perylene. However, this is not exhaustive.

Materials which can be used for the pixel electrode 124 include, for example, nickel, silver, gold, platinum, palladium, selenium, rhodium, ruthenium, iridium, rhenium, tungsten, molybdenum, chromium, tantalum, niobium, their alloys, tin oxide ($SnO_2$), indium tin oxide (ITO), zinc oxide, and titanium oxide. However, they are not exhaustive. In addition, materials which can be used for the common electrode 126 include, for example, alloys between active metals such as Li, Mg, and Ca and metals such as Ag, Al, and In or multilayer structures formed from these materials. However, they are not exhaustive.

The arrangement of the pixel 120 in the pixel unit 106 will be further described with reference to FIG. 3. The pixel 120 includes the organic EL element 122 and a transistor 132. The peripheral edge portion of the pixel electrode 124 is covered with a bank layer 130. The organic EL layer 125 is provided on the upper surface of the pixel electrode 124 and on the bank layer 130. A sealing film 128 may be provided on the upper surface side of the organic EL element 122. The sealing film 128 is provided to cover substantially the front surface of the pixel unit 106.

According to this embodiment, to have a top emission type pixel arrangement, the organic EL element 122 preferably has an arrangement in which the common electrode 126 has translucency and a light-reflecting surface is provided for the pixel electrode 124. The organic EL layer 125 emits light in all directions within a solid angle of $4\pi$. For this reason, light emitted toward the second substrate 104 includes at least both a light component directly emitted from the organic EL layer 125 and a light component which is reflected by the pixel electrode 124 and propagates toward the second substrate 104. In any case, light emitted from the organic EL layer 125 strikes the second substrate 104 at various angles.

A potential common to a plurality of pixels is applied to the common electrode 126. In contrast to this, an individual potential for each pixel is applied to the pixel electrode 124. This controls a current flowing in the organic EL element 122. A transistor 132 controls the potential of the pixel electrode 124.

The transistor 132 is a field-effective transistor with a semiconductor layer 134 and a gate electrode 138 being insulated by a gate insulating layer 136. More specifically, the transistor 132 has a thin film transistor form having a channel formed in the thin film semiconductor layer 134. A dielectric interlayer 144 is preferably provided between the transistor 132 and the organic EL element 122. The pixel electrode 124 is provided on the dielectric interlayer 144 and is connected to a source-drain electrode 140 via a contact hole.

Note that when the organic EL element 122 is designed for white luminescence, the second substrate 104 may be provided with a light-shielding layer 146, a color filter layer 148, and an overcoat layer 150. This arrangement enables color display.

The flexible display device 100 according to this embodiment is provided with, on the light exit surface side (display screen side) from which light from the pixel unit 106 exits, the optical elements integrated with the substrate for sealing. This makes it possible to improve light extraction efficiency while achieving a reduction in thickness. A producing method of such a flexible display device will be described next.

(Producing Method)

An outline of a producing method of a flexible display device according to an embodiment of the present invention will be described. As a producing process for a flexible display device, a known producing process can be used.

First of all, a pixel circuit is formed on a first substrate. At this time, a scanning line driving circuit, a video signal line driving circuit, an input terminal unit, and the like are also formed on the substrate, as needed. Elements such as transistors and capacitors constituting the pixel circuit are produced by repeatedly stacking thin films formed from semiconductors, insulators, and metals and patterning the films using a photolithography method.

Luminescence elements are formed on a circuit element layer on which the pixel circuit and the like are formed. A pixel electrode electrically connected to the pixel circuit is formed to form the organic EL element of each pixel. Each pixel electrode is formed on a dielectric interlayer in which transistors are embedded. A bank layer is formed to cover the peripheral edge portion of each pixel electrode. The pixel electrode is formed for each pixel, and the peripheral edge portion is surrounded by a bank layer, thereby demarcating each pixel region.

A hole transport layer, a light emitting layer, and an electron transport layer are formed on each pixel electrode. At this time, each layer is formed by using a material containing a polyacrylamide according to this embodiment described above. For example, a printing method using an inkjet can be used to form each layer. According to an embodiment, a hole injection layer may be formed between a pixel electrode and a hole transport layer, and an electron injection layer may be formed between a common electrode and the electron transport layer. An organic EL layer can be formed in this manner.

Furthermore, a common electrode is formed. A sealing film is formed on a layer above the common electrode by using a silicon nitride film or the like. In this manner, the pixel circuit and a pixel unit can be formed.

Second Embodiment

The first embodiment has exemplified the case in which an organic thin film is formed by using a material containing a polyacrylamide having both a host part and a guest part in one molecule. The second embodiment will exemplify a case in which a polyacrylamide having only a host part is used for one of adjacent organic thin films, and a polyacrylamide having only a guest part is used for the other film.

Figure 6:
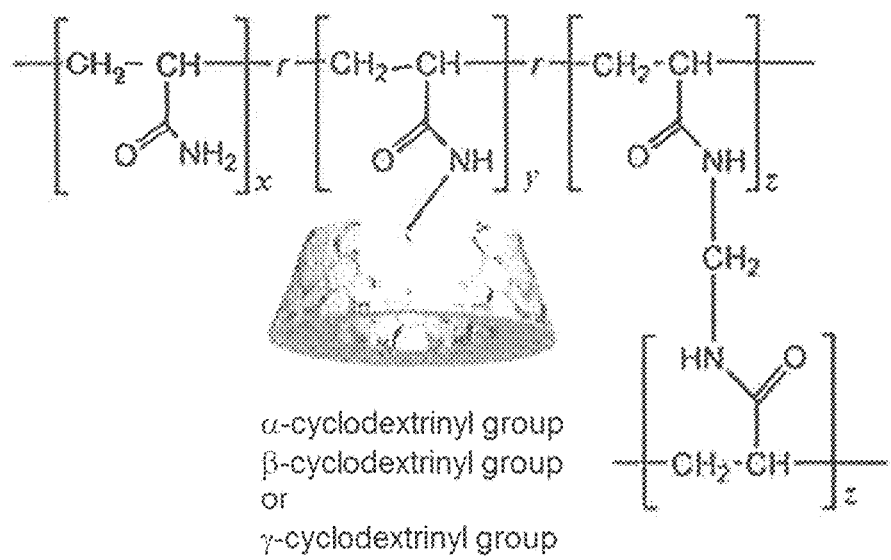
FIG. 6 shows chemical formula (3)
Figure 7:
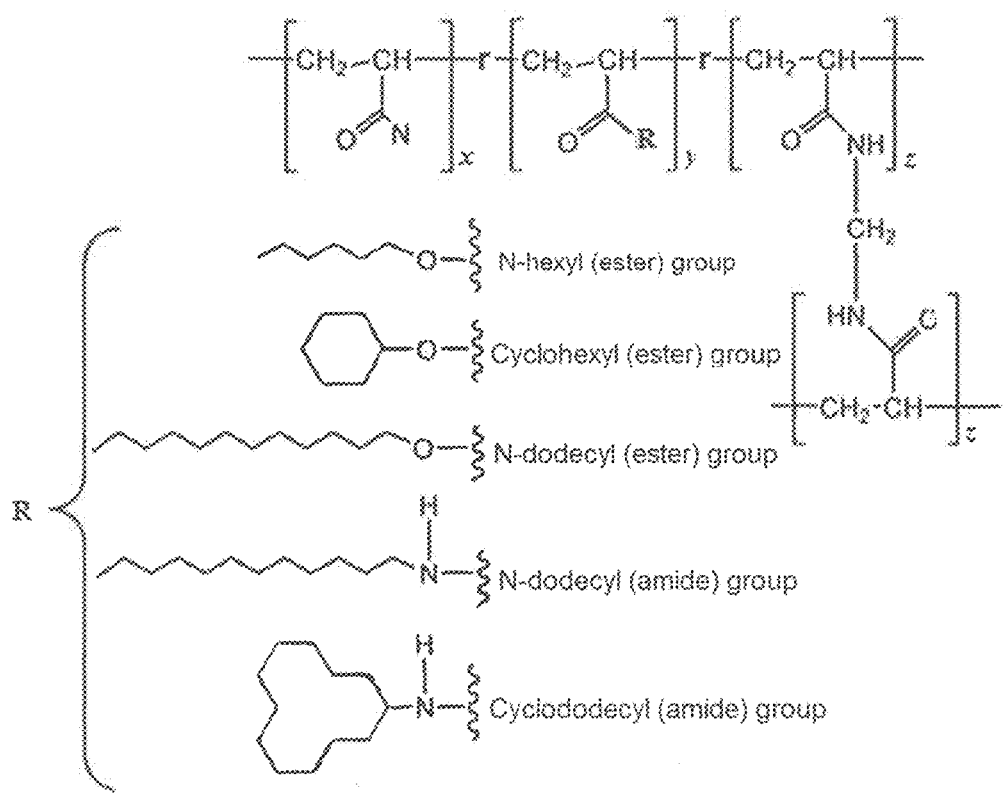
FIG. 7 shows chemical formula (4).

In an embodiment, one of adjacent layers among a hole transport layer 112, a light emitting layer 114, and an electron transport layer 116 may contain a polyacrylamide having an α-cyclodextrinyl group as a host part, and the other layer may contain a polyacrylamide having only a guest part selected from an n-butyl (ester) group, n-hexyl (ester) group, n-dodecyl (ester) group, and n-dodecyl (amide) group. That is, only the hole transport layer 112 and the electron transport layer 116 or the light emitting layer 114 may contain a polyacrylamide having only a host part, and the remaining one or ones of the layers may contain a polyacrylamide having only a guest part. Such polyacrylamides may be combinations of compounds expressed by chemical formula (3) shown in FIG. 6 and chemical formula (4) shown in FIG. 7.

In an embodiment, one of adjacent layers among a hole transport layer 112, a light emitting layer 114, and an electron transport layer 116 may contain a polyacrylamide having a β-cyclodextrinyl group as a host part, and the other layer may contain a polyacrylamide having a guest part selected from an adamantyl group, cyclohexyl (ester) group, and cyclododecyl (amide) group. That is, only the hole transport layer 112 and the electron transport layer 116 or the light emitting layer 114 may contain a polyacrylamide having only a host part, and the remaining one or ones of the layers may contain a polyacrylamide having only a guest part. Such polyacrylamides may be combinations of compounds expressed by chemical formulae (3) and (4).

In an embodiment, one of adjacent layers among a hole transport layer 112, a light emitting layer 114, and an electron transport layer 116 may contain a polyacrylamide having a γ-cyclodextrinyl group as a host part, and the other layer may contain, as a guest part, a polyacrylamide as a cyclododecyl (amide) group. That is, only the hole transport layer 112 and the electron transport layer 116 or the light emitting layer 114 may contain a polyacrylamide having only a host part, and the remaining one or ones of the layers may contain a polyacrylamide having only a guest part. Such polyacrylamides may be combinations of compounds expressed by chemical formulae (3) and (4).

Although the above combinations of polyacrylamides are disclosed in, for example, Hiroyasu Yamaguchi et al., Macromolecules 2011, 44, 2395-2399, there is no description about the application of such materials to the hole transport layer 112, the light emitting layer 114, and the electron transport layer 116 according to this embodiment. That is, such application is disclosed for the first time in the present invention.

In an embodiment, a hole transport layer 112, a light emitting layer 114, and an electron transport layer 116 each preferably contain 0.1 wt % or more and 10 wt % or less of the above polyacrylamide. Setting such a concentration range will prevent the polyacrylamide from greatly influencing the electrical and optical properties of the flexible display device.

Letting the hole transport layer 112, the light emitting layer 114, and the electron transport layer 116 contain combinations of polyacrylamides selected from these materials will make host parts and guest parts interact with each other in the interfaces among the hole transport layer 112, the light emitting layer 114, and the electron transport layer 116. This makes it possible to provide a flexible display device with improved adhesion between organic thin films.

In addition, the flexible display device according to this embodiment need not apply any modifications or the like to an organic semiconductor material itself which is in charge of charge transport and luminescence. This also produces the effect of broadening the range of choice of semiconductor materials.

In an embodiment, in an organic EL layer 125, a hole injection layer may be arranged between a pixel electrode 124 and a hole transport layer 112, and an electron injection layer may be arranged between a common electrode 126 and an electron transport layer 116. In the organic EL layer 125 having this arrangement, the hole injection layer and the electron injection layer each may contain a combination of polyacrylamides according to this embodiment described above.

Note that this embodiment can use known materials described above as materials for a hole transport layer 112, a light emitting layer 114, an electron transport layer 116, a hole injection layer, and an electron injection layer.

Note that since the flexible display device according to this embodiment can be produced by the producing method described in the first embodiment, a detailed description will be omitted.

Third Embodiment

The third embodiment will exemplify the distribution of polyacrylamides according to this embodiment which are contained in a hole transport layer 112, a light emitting layer 114, and an electron transport layer 116. In an embodiment, it is preferable to uniformly disperse a polyacrylamide in an overall organic thin film. It is possible to prevent stress from being applied to a specific portion of an organic thin film by uniformly dispersing a polyacrylamide according to this embodiment in the overall organic thin film.

In addition, in an embodiment, a polyacrylamide may be distributed such that a large amount of this material is distributed near the surface (interface) of an organic thin film. Such an organic thin film can be formed by stacking materials having different polyacrylamide concentrations so as to control a concentration distribution in one layer in a printing method using an inkjet. Using a film with a polyacrylamide being dispersed at a high concentration in the surface of an organic thin film will hold the electrical and optical properties by reducing the polyacrylamide concentration inside each organic thin film while ensuring the adhesion between the organic thin films.

Fourth Embodiment

The first and second embodiments have exemplified the case in which all the hole transport layer 112, the light emitting layer 114, and the electron transport layer 116 are made to contain a polyacrylamide according to the present invention to improve the adhesion between the organic thin films. The fourth embodiment will exemplify a case in which a light emitting layer 114 does not contain any polyacrylamides according to the present invention or contains a polyacrylamide at a concentration lower by one or more order of magnitude than the hole transport layer 112 or the electron transport layer 116.

Referring to FIG. 2, an organic EL layer 125 includes a first multilayer portion 172 obtained by stacking the hole transport layer 112, the light emitting layer 114, and the electron transport layer 116 and a second multilayer portion 174 obtained by stacking the hole transport layer 112 and the electron transport layer 116. In this arrangement, only the hole transport layer 112 and the electron transport layer 116 contain polyacrylamides according to the present invention to obtain sufficient adhesion between the hole transport layer 112 and the electron transport layer 116. That is, it is possible to provide a flexible display device with improved adhesion between organic thin films without making the light emitting layer 114 contain any polyacrylamides according to the present invention. Alternately, the light emitting layer 114 may contain a polyacrylamide at a concentration lower by one or more order of magnitude than the hole transport layer 112 or the electron transport layer 116.

This arrangement enables the flexible display device according to the present invention to hold the properties associated with luminescence without being influenced by polyacrylamides according to the present invention in the light emitting layer 114 or reducing the influence. This is because the presence of a contact portion between the hole transport layer 112 and the electron transport layer 116 above a bank layer 130 as shown in FIG. 2 can prevent polyacrylamides according to the present invention from influencing the luminescence material for the light emitting layer 114 while ensuring adhesion owing to the effect of the polyacrylamides.

What is claimed is:

1. A flexible display device comprising:
   a hole transport layer, a light emitting layer, an electron transport layer arranged between a first electrode layer and a second electrode layer,
   wherein the hole transport layer and the electron transport layer each contain a polyacrylamide including a first part and a second part,
   the first part is selected from the group consisting of an α-cyclodextrinyl group, a β-cyclodextrinyl group, and a γ-cyclodextrinyl group, and
   the second part is selected from the group consisting of an n-butyl (ester) group, an n-hexyl (ester) group, an n-dodecyl (ester) group, an n-dodecyl (amide) group, an adamantyl group, a cyclohexyl (ester) group and a cyclododecyl (amide) group.

2. The flexible display device according to claim 1, wherein the hole transport layer and the electron transport layer each contain a polyacrylamide with the host part comprising an α-cyclodextrinyl group, and the guest part being selected from the group consisting of an n-butyl (ester) group, an n-hexyl (ester) group, an n-dodecyl (ester) group, and an n-dodecyl (amide) group.

3. The flexible display device according to claim 1, wherein the hole transport layer and the electron transport layer each contain a polyacrylamide with the host part comprising a β-cyclodextrinyl group, and the guest part being selected from the group consisting of an adamantyl group, a cyclohexyl (ester) group, and a cyclododecyl (amide) group.

4. The flexible display device according to claim 1, wherein the hole transport layer and the electron transport layer each contain a polyacrylamide with the host part comprising a γ-cyclodextrinyl group, and the guest part comprising a cyclododecyl (amide) group.

5. The flexible display device according to claim 1, wherein one of the hole transport layer and the electron transport layer contains a polyacrylamide comprising an α-cyclodextrinyl group as a host part, and the other contains a polyacrylamide comprising a guest part selected from the group consisting of an n-butyl (ester) group, an n-hexyl (ester) group, an n-dodecyl (ester) group, and an n-dodecyl (amide) group.

6. The flexible display device according to claim 1, wherein one of the hole transport layer and the electron transport layer contains a polyacrylamide comprising a β-cyclodextrinyl group as a host part, and the other contains a polyacrylamide comprising a guest part selected from the group consisting of an adamantyl group, a cyclohexyl (ester) group, and a cyclododecyl (amide) group.

7. The flexible display device according to claim 1, wherein one of the hole transport layer and the electron transport layer contains a polyacrylamide comprising a γ-cyclodextrinyl group as a host part, and the other contains a polyacrylamide comprising a cyclododecyl (amide) group as a guest part.

8. The flexible display device according to claim 1, wherein the light emitting layer contains a polyacrylamide including a third part and a fourth part, the third part is selected from the group consisting of an α-cyclodextrinyl group, a β-cyclodextrinyl group, and a γ-cyclodextrinyl group, and the fourth part is selected from the group consisting of an n-butyl (ester) group, an n-hexyl (ester) group, an n-dodecyl (ester) group, an n-dodecyl (amide) group, an adamantyl group, a cyclohexyl (ester) group and a cyclododecyl (amide) group.

9. The flexible display device according to claim 1, further comprising:
   a first multilayer portion stacking the hole transport layer, the light emitting layer, and the electron transport layer; and
   a second multilayer portion stacking the hole transport layer and the electron transport layer.

10. A producing method of flexible display device comprising:
   forming a hole transport layer on a first electrode layer;
   forming a light emitting layer on the hole transport layer;
   forming an electron transport layer on the light emitting layer; and
   forming a second electrode layer on the electron transport layer,
   wherein the hole transport layer and the electron transport layer each are formed by using a material containing a polyacrylamide including a first part and a second part,
   the first part is selected from the group consisting of an α-cyclodextrinyl group, a β-cyclodextrinyl group, and a γ-cyclodextrinyl group, and
   the second part is selected from the group consisting of an n-butyl (ester) group, an n-hexyl (ester) group, an n-dodecyl (ester) group, an n-dodecyl (amide) group, an adamantyl group, a cyclohexyl (ester) group and a cyclododecyl (amide) group.

11. The producing method of flexible display device according to claim 10, wherein the hole transport layer and the electron transport layer each are formed from a film, the polyacrylamide is dispersed in the film.

12. The producing method of flexible display device according to claim 10, wherein the hole transport layer and the electron transport layer each are formed from a film, the polyacrylamide is dispersed in a surface of the film at a high concentration.

13. The producing method of flexible display device according to claim 11, wherein the light emitting layer is formed from a film, the polyacrylamide is dispersed in the film.

14. The producing method of flexible display device according to claim 12, wherein the light emitting layer is formed from a film, the polyacrylamide is dispersed in a surface of the film at a high concentration.

15. The producing method of flexible display device according to claim 10, further comprising:
   forming a first multilayer portion by stacking the hole transport layer, the light emitting layer, and the electron transport layer; and
   forming a second multilayer portion by stacking the hole transport layer and the electron transport layer.

16. The flexible display device according to claim 8, wherein the first part and the third part are the same, and the second part and the fourth part are the same.

* * * * *